United States Patent [19]
Hashimoto et al.

[11] Patent Number: 4,610,953
[45] Date of Patent: Sep. 9, 1986

[54] AQUEOUS DEVELOPER SOLUTION FOR POSITIVE TYPE PHOTORESISTS WITH TETRAMETHYL AMMONIUM HYDROXIDE AND TRIMETHYL HYDROXYETHYL AMMONIUM HYDROXIDE

[75] Inventors: Koichiro Hashimoto, Chigasaki; Shirushi Yamamoto, Isehara; Hisashi Nakane, Kawasaki; Akira Yokota, Yamato, all of Japan

[73] Assignee: Tokyo Ohka Kogyo Co., Ltd., Kawasaki, Japan

[21] Appl. No.: 614,908

[22] Filed: May 29, 1984

[30] Foreign Application Priority Data

May 28, 1983 [JP] Japan ................. 58-93345

[51] Int. Cl.$^4$ ............................................. G03C 5/00
[52] U.S. Cl. ..................... 430/331; 430/149; 430/154; 430/309; 430/326; 252/541; 252/547; 252/548
[58] Field of Search ............... 430/331, 309, 149, 326, 430/154; 252/541, 547, 548

[56] References Cited

U.S. PATENT DOCUMENTS

| 4,141,733 | 2/1979 | Guild .................. 430/331 |
| 4,239,661 | 12/1980 | Muraoka et al. ............. 252/541 |
| 4,294,911 | 10/1981 | Guild .................. 430/331 |
| 4,411,981 | 10/1983 | Minezaki ............... 430/166 |
| 4,423,138 | 12/1983 | Guild .................. 430/331 |

FOREIGN PATENT DOCUMENTS

| 62733 | 10/1982 | European Pat. Off. ........... 430/331 |
| 51-56226 | 5/1976 | Japan ..................... 430/331 |
| 1367830 | 9/1974 | United Kingdom ............... 430/331 |

OTHER PUBLICATIONS

Asano et al., Extended Abstracts, The Electrochem. Soc., Inc., Fall Meeting, vol. 76-2, pp. 911–913, Abstract #354, 10/1976.
Grieco et al., IBM Technical Disclosure Bulletin, vol. 13 (7), p. 2009 (1970).

*Primary Examiner*—Charles L. Bowers, Jr.
*Attorney, Agent, or Firm*—Armstrong, Nikaido, Marmelstein & Kubovcik

[57] ABSTRACT

The invention provides an aqueous alkaline developer solution for a positive-type photoresist layer for patternwise treatment of the surface of a substrate, e.g., semiconductor wafer. The developer solution contains a tetraalkyl ammonium hydroxide, e.g., tetramethyl ammonium hydroxide, and a trialkyl hydroxyalkyl ammonium hydroxide, e.g., trimethyl hydroxyethyl ammonium hydroxide, as the essential ingredients and the temperature dependency of the development performance thereof is noticeably smaller than that of conventional developer solutions with respect to properties of the sensitivity of the photoresist and the thickness reduction of the photoresist layer in the unexposed areas, by virtue of the compensating temperature dependencies for these properties of these two ingredients for each other.

4 Claims, No Drawings

AQUEOUS DEVELOPER SOLUTION FOR POSITIVE TYPE PHOTORESISTS WITH TETRAMETHYL AMMONIUM HYDROXIDE AND TRIMETHYL HYDROXYETHYL AMMONIUM HYDROXIDE

BACKGROUND OF THE INVENTION

The present invention relates to a developer solution for positive-type photoresists or, more particularly, to a developer solution for positive-type photoresists which is usable in the development treatment of a photoresist, without any limitations concerning temperature dependencies of the sensitivity and the solubility of the unexposed photoresist material in the solution.

As is well known, the photolithographic process using a photoresist material is widely practiced in the manufacture of semiconductor devices, printed circuit boards, printing plates and the like products with an object to provide image-wise protection to the surface of the substrate, which is subjected to a surface treatment such as etching, metal plating and diffusion. The photoresist process is performed by use of a photoresist material, or merely resist, which is a resinous organic polymer having photosensitivity, and the process comprises the steps of coating the surface of the substrate uniformly with the photoresist, followed by heat treating the surface to provide a photoresist layer thereon, exposing the photoresist layer to ultraviolet light image-wise or pattern-wise, for example, through a photomask mounted thereon so as to produce a difference in the solubility of the photoresist between the exposed and unexposed areas, developing the photoresist layer to form a pattern of the photoresist by partially removing the photoresist material from the areas where the photoresist has a larger solubility, and subjecting the thus-exposed patterned portions of the substrate to a subsequent treatment.

Photoresist materials in general can be classified as the so-called negative and positive-types. In the negative-type photoresist materials, the resin is cured by irradiation with light so that the photoresist on the unexposed areas can be dissolved and removed away by a developer solution used in the development to leave a pattern-wise photoresist layer on the exposed areas. On the other hand, the solubility of the positive-type photoresist resin is increased by the irradiation with light to such an extent that the developer solution can dissolve away the photoresist on the areas exposed to light, leaving a pattern-wise photoresist layer on the unexposed areas. Generally, positive-type photoresists are preferred over negative-type ones because they provide higher sharpness and larger resolving power of the images, have an insusceptibility to influence of atmospheric oxygen in the course of exposure to light, and have a stability of the photoresist layer formed on the substrate surface by coating.

The photosensitive resins in most of the positive-type photoresists currently available on the market contain naphthoquinone diazide which provide the photosensitive groups, and the photoresist typically comprises an alkali-soluble novolac resin and an ester of a naphthoquinone diazide compound and a phenolic compound or a polymer having phenolic hydroxy groups as a sensitizer. When irradiated with light, the quinone diazide group in the positive-type photoresist as described above is photochemically decomposed to form an indene carboxylic acid through an indene ketene which is soluble in alkali so that the photoresist is dissolved by reaction thereof with an organic or inorganic alkali. Thus, the developer solution used in the development of a positive-type photoresist is usually an aqueous alkali solution which dissolves the alkali soluble acid produced from the photoresist by the photochemical reaction.

The alkaline developer solution of the most conventional type is an aqueous solution containing sodium metasilicate, sodium hydroxide or sodium phosphate as the principal ingredient. Such an alkaline developer solution, however, cannot be used in the manufacturing process of semiconductor devices, for example, the formation of a pattern-wise photoresist layer on a semiconductor silicon wafer, because alkali metals including sodium are the most detrimental impurities in semiconductors.

Accordingly, the developer solution widely used in semiconductor processing is an aqueous alkaline solution containing a quaternary ammonium salt or a mixture of an amine and an alcohol and the like organic base. A problem in a developer solution of this type is that it has a remarkable temperature dependency on the sensitivity of the photoresist, so that difficulties are encountered in the control of the line width of the photoresist pattern in the course of the development treatment. The difficulty in the line width control is particularly large in the spray development because evaporation of the solvent from the sprayed developer solution necessarily causes a considerable temperature decrease of the solution. As a consequence, the photoresist pattern is poor in the sharpness of the image with unsatisfactory reproducibility, so that development treatments with such a developer solution must be performed by controlling the temperature of the solution usually within $\pm 1°$ C. of the recommended temperature for the development.

Thus, it has been eagerly desired to develop a developer solution for a positive-type photoresist free from the above described limitation concerning the requirement for the exact temperature control of the developer solution.

SUMMARY OF THE INVENTION

An object of the present invention is therefore to provide a novel developer solution for a positive-type photoresist free from the above described problem in the conventional aqueous alkaline developer solution in connection with the requirement for exact temperature control.

Another object of the invention is to provide a method for developing a positive-type photoresist layer after exposure to light in which no exact temperature control of the developer solution is required.

Thus, the developer solution for a positive-type photoresist according to the present invention comprises:
(a) a tetraalkyl ammonium hydroxide;
(b) a trialkyl hydroxyalkyl ammonium hydroxide; and
(c) water as the solvent of the components (a) and (b).

In particular, the tetraalkyl ammonium hydroxide is preferably tetramethyl ammonium hydroxide and the trialkyl hydroxyalkyl ammonium hydroxide is preferably trimethyl hydroxyethyl ammonium hydroxide.

Further, the concentrations of the tetraalkyl ammonium hydroxide and the trialkyl hydroxyalkyl ammonium hydroxide in the developer solution are preferably in the ranges from 0.5 to 3.0% by weight and from 1.0 to 4.0% by weight of the developer solution, respectively.

DETAILED DESCRIPTION OF THE PREFERRED EMBODIMENTS

The above described developer solution of the invention for a positive-type photoresist has been developed as a result of the extensive investigations undertaken by the inventors with an object to provide a novel developer solution free from the problem of the temperature dependency on the sensitivity of the photoresist, which led to a discovery that, when an aqueous solution of a tetraalkyl ammonium hydroxide and an aqueous solution of a triakyl hydroxyalkyl ammonium hydroxide are used each alone as a developer solution of a positive type photoresist, the temperature dependency on the sensitivity of the photoresist when using one of them is reversed to that when using the other. The present invention has been completed on the basis of this discovery.

The alkyl group in the tetraalkyl ammonium hydroxide has preferably from 1 to 3 carbon atoms and, more preferably, the alkyl group is a methyl group. Accordingly, the tetraalkyl ammonium hydroxide is preferably tetramethyl ammonium hydroxide, which is referred to as TMAH hereinbelow. The alkyl group in the trialkyl hydroxyalkyl ammonium hydroxide, on the other hand, also should have from 1 to 3 carbon atoms and should preferably be a methyl group. The hydroxyalkyl group also should have from 1 to 3 carbon atoms, but the most preferably hydroxyalkyl group is a hydroxyethyl group. Accordingly, the preferable trialkyl hydroxyalkyl ammonium hydroxide is trimethyl hydroxyethyl ammonium hydroxide, which is referred to as THAH hereinbelow.

When an aqueous solution of TMAH is used as a developer solution of a positive type photoresist, its sensitivity is highest at a temperature in the range from 20° to 25° C. and decreases as the temperature of the developer solution is increased above or decreased below this temperature range. When an aqueous solution of THAH is used as the developer solution, on the other hand, higher temperatures of the solution always result in higher sensitivity.

In connection with the relationship between the temperature of the developer solution and the thickness reduction of the photoresist layer in the unexposed areas, it has been found that an increase in the temperature of the developer solution has an effect of decreasing the thickness reduction, when the developer solution is an aqueous solution of TMAH, but increasing the thickness reduction when an aqueous solution of THAH is used in the developer solution.

The principle of the advantages obtained with the inventive developer solution result from the combination of the different characteristics possessed by TMAH and THAH when each is used singly in the form of an aqueous solution as a developer solution; and the combined use thereof mixed together in an aqueous solution provides a novel developer solution for a positive-type photoresist with which the temperature dependencies can be minimized with respect to the sensitivity of the photoresist and the solubility of the photoresist in the unexposed areas.

A preferable formulation of the inventive developer solution should contain from 0.5 to 3.0% by weight or, preferably, from 1.0 to 2.0% by weight of the tetraalkyl ammonium hydroxide, e.g., TMAH, and from 1.0 to 4.0% by weight or, preferably, from 2.0 to 3.0% by weight of the trialkyl hydroxyalkyl ammonium hydroxide, e.g., THAH, in the solution, the balance being water. When the concentrations of these components are lower than the above ranges, the sensitivity of the photoresist is unduly decreased. When the concentrations thereof are excessively high, on the other hand, a disadvantage is caused in the increase of the thickness reduction of the photoresist layer in the unexposed areas.

Owing to the very small dependencies on temperature of the developer solution of the present invention, in the development treatment with respect to the sensitivity of the photoresist and the thickness reduction of the photoresist layer in the unexposed areas by dissolution in the developer solution, the temperature of the developer solution in the course of the development is relatively free from limitation. It is, however, recommendable that the development should be performed with the inventive developer solution at a temperature in the range from 20° to 40° C., since the sensitivity of the photoresist is too small to be practical at a temperature below 20° C.

The manner in which the inventive developer solution is used for development is not particularly limited and any conventional method is applicable, including dipping and spraying, which provide quite satisfactory results.

In addition, it is of course optional to add small amounts of additives such as coloring inhibitor, surface active agent and the like, if so desired to obtain further improvements.

The positive-type photoresist compositions which can be subjected to development treatment by use of the developer solution of the present invention include those containing a quinone diazide type compound as the photosensitive component such as o-benzoquinone diazide, o-naphthoquinone diazide and o-anthraquinone diazide as well as nucleus-substituted derivatives thereof, e.g., esters of o-naphthoquinone diazide sulfonic acid. Furthermore, the photosensitive component in the photoresist can be a reaction product of o-quinone diazide sulfonyl chloride and a compound having a hydroxy or amino group in the molecule such as phenol, 4-methoxyphenol, dimethyl phenol, hydroquinone, bisphenol A, naphthol, trihydroxy benzophenone, pyrocatechol, pyrogallol, pyrogallol monomethyl ether, gallic acid, esterified or etherified gallic acid leaving one or two of the hydroxy groups in the molecule, aniline, 4-aminodiphenyl amine and the like.

The film-forming component in the photoresist composition is an alkali-soluble resin exemplified by novolac resins, polyvinyl alcohols, polyvinyl alkyl ethers, copolymers of styrene and acrylic acid, copolymers of acrylic acid and an alkyl methacrylate, polymers of hydroxystyrene, polyvinyl hydroxybenzoate, polyvinyl hydroxybenzal and the like.

Several grades of positive-type photoresist compositions are commercially available on the market, of which preferable ones include the Microposit-series products manufactured by Shipley Co., AZ-series products manufactured by Hoechst Co., HPR-series products manufactured by Hunt Chemical Co., OFPR-series products manufactured by TOKYO OHKA KOGYO CO., LTD., and the like. Particularly preferable positive type photoresist compositions are those comprising a novolac resin and an esterification product obtained by the condensation reaction between naphthoquinone-(1,2)-diazido-(2)-5-sulfonyl chloride and 2,3,4-trihydroxy benzophenone described in Japanese Patent Publication No. 37-18015. These commercially available positive-type photoresists can also be used with the developer solution of the presently claimed invention.

When a positive-type photoresist layer of the composition of the above-described type is subjected to the development treatment after pattern-wise exposure to light by use of the inventive developer solution, changes in the temperature of the developer solution only have very small influences on the sensitivity of the photoresist and the thickness reduction of the photoresist layer in the unexposed areas, so that the temperature control of the developer solution in the development treatment need not be so exact as in the use of a conventional developer solution. Accordingly, this aspect of the present invention greatly facilitates the line width control of the patterned photoresist layer. In particular, development treatment by spraying of the developer solution can be easily performed with good line width control by use of the inventive developer solution, in contrast to what it has been generally understood by those in the art; namely, that the spraying development is not suitable when exactness is desired in the line width control due to the uncontrollable temperature decrease of the solution by the evaporation of the solvent by spraying. Thus, the developer solution of the present invention is very advantageous because a pattern-wise photoresist layer of high resolving power can readily be obtained with very little fluctuation in the line width of the pattern.

In the following, the present invention is described in more detail by way of examples.

EXAMPLE 1

An aqueous developer solution wa prepared by dissolving in water, tetramethyl ammonium hydroxide and trimethyl hydroxyethyl ammonium hydroxide in amounts to give concentrations of 1.4% by weight and 2.1% by weight, respectively, in the resulting developer solution.

A positive-type photoresist composition was prepared by dissolving 3.2 parts by weight of an esterification product obtained by the condensation reaction, according to the disclosure in Japanese Patent Publication No. 37,18015, between 1 mole of 2,3,4-trihydroxy benzophenone and 2 moles of naphthoquinone-(1,2)-diazido-(2)-5- sulfonyl chloride and 12.8 parts by weight of a cresol formaldehyde resin in 84 parts by weight of ethyleneglycol monoethyl ether acetate.

A substrate plate was uniformly coated with this positive-type photoresist composition to give a film thickness of 1.3 $\mu$m after drying by a heat treatment. This was followed by exposure to light, and then developed by dipping for 60 seconds or 180 seconds in the above prepared developer solution. The temperature of the developer solution was varied to 20°, 25°, 30° and 40° C. The results obtained by the determination of the sensitivity of the photoresist and the thickness reduction of the photoresist layer in the unexposed areas are shown in Table 1. As is clear from the results, the sensitivity of the photoresist and the thickness reduction of the photoresist layer in the unexposed areas are only slightly dependent on the temperature of the developer solution.

COMPARATIVE EXAMPLE 1

The experimental procedure as in Example 1 was repeated except that the developer solution used in this case was an aqueous solution of tetramethyl ammonium hydroxide alone in a concentration of 2.5% by weight. The sensitivity of the photoresist and the thickness reduction of the photoresist layer in the unexposed areas are also shown in Table 1.

As is clear from the table, the temperature dependencies of the sensitivity of the photoresist and the thickness reduction of the photoresist layer in the unexposed areas are considerably large, with decrease in the sensitivity and decrease in the thickness reduction as the temperature of the developer solution is increased.

COMPARATIVE EXAMPLE 2

The same experimental procedure as in Example 1 was repeated, except that the developer solution used in this case was an aqueous solution containing trimethyl hydroxyethyl ammonium hydroxide alone in a concentration of 4.5% by weight. The sensitivity of the photoresist and the thickness reduction of the photoresist layer in the unexposed areas are shown in Table 1 for each of the temperatures of the developer solution.

As is clear from the table, the temperature dependencies of the photosensitivity of the photoresist and the thickness reduction of the photoresist layer are considerably large with increase in the sensitivity and increase in the thickness reduction as the temperature of the developer solution increases.

Further, comparison of the data of the thickness reduction in Example 1 and Comparative Examples 1 and 2 between the development time of 60 seconds and 180 seconds indicates that the increase of the thickness reduction is relatively small when the inventive developer solution is used even when the developing time is unduly extended so that the inventive developer solution can be used without exact control of the developing time.

TABLE 1

|  | Temperature of developer solution, °C. | Sensitivity seconds. (*1) | Thickness reduction, nm | | |
|---|---|---|---|---|---|
|  |  |  | 60 second development (a) | 180 seconds development (b) | (b)/(a) |
| Example 1 | 20 | 4.1 | 110 | 220 | 2.0 |
|  | 25 | 3.7 | 130 | 260 | 2.0 |
|  | 30 | 3.7 | 130 | 270 | 2.1 |
|  | 40 | 3.7 | 130 | 300 | 2.3 |
| Comparative Example 1 | 20 | 3.3 | 120 | 400 | 3.3 |
|  | 25 | 3.5 | 90 | 310 | 3.4 |
|  | 30 | 3.9 | 70 | 240 | 3.4 |
|  | 40 | 5.3 | 50 | 170 | 3.4 |
| Comparative Example 2 | 20 | 4.2 | 80 | 310 | 3.9 |
|  | 25 | 3.7 | 90 | 420 | 4.7 |
|  | 30 | 3.4 | 100 | 520 | 5.2 |
|  | 40 | 2.6 | 140 | 1050 | 7.5 |

(*1) Sensitivity is given by the minimum exposure time in seconds required for the image reproduction with fidelity of the pattern on the photomask.

EXAMPLE 2

A substrate plate was coated uniformly with the same photoresist composition as used in Example 1, followed by a heat treatment, and the resulting photoresist layer was exposed to light through a photomask having a line pattern of 3.0 $\mu$m line width to give a predetermined irradiation dose. The thus pattern-wise exposed photoresist layer on the substrate was developed by respectively dipping for 60 seconds in the developer solution prepared in Example 1, Comparative Example 1 and Comparative Example 2 at different temperatures, as shown below and the width of the line pattern of the photoresist layer as developed was measured to give the results shown in Table 2 below for each of the developer solutions at each of the temperatures of the solution.

As is clear from the table, the line width obtained by use of the inventive developer solution had higher fidelity and higher reproducibility than those obtained by use of the comparative developer solutions. In particular, the line width obtained by use of the developer solution of the present invention varies little with respect to temperature of the developer solution.

TABLE 2

| Temper- | Developer solution | | |
| --- | --- | --- | --- |
| ature | Example 1 | Comparative Example 1 | Comparative Example 2 |
| 20° C. | 2.9 μm | 2.85 μm | 3.17 μm |
| 25 | 3.0 | 3.0 | 3.0 |
| 30 | 3.05 | 3.18 | 2.75 |

What is claimed is:

1. A temperature-independent aqueous developer solution for a positive type photoresist which comprises:
   (a) 0.5 to 3.0% by weight, based on the developer solution, of tetramethyl ammonium hydroxide;
   (b) 1.0 to 4.0% by weight, based on the developer solution, of trimethyl hydroxyethyl ammonium hydroxide; and
   (c) water as the solvent of the components (a) and (b).

2. The aqueous developer solution as claimed in claim 1, wherein the concentration of the tetramethyl ammonium hydroxide therein is in the range from 1.0 to 2.0% by weight.

3. The aqueous developer solution as claimed in claim 1, wherein the concentration of the trimethyl hydroxyalkyl ammonium hydroxide therein is in the range of from 2.0 to 3.0% by weight.

4. The aqueous developer solution as claimed in claim 1, which can maintain a consistent line width pattern within a developement temperature of 20° to 40° C.

* * * * *